(12) United States Patent
Zheng et al.

(10) Patent No.: US 12,525,947 B2
(45) Date of Patent: Jan. 13, 2026

(54) SURFACE ACOUSTIC WAVE RESONATOR AND MANUFACTURING METHOD THEREFOR

(71) Applicant: HANGZHOU SAPPLAND MICROELECTRONICS TECHNOLOGY CO., LTD., Hangzhou (CN)

(72) Inventors: Genlin Zheng, Hangzhou (CN); Shumin Zhang, Hangzhou (CN)

(73) Assignee: Hangzhou Sappland Microelectronics Technology Co., LTD., Hangzhou (CN)

( * ) Notice: Subject to any disclaimer, the term of this patent is extended or adjusted under 35 U.S.C. 154(b) by 344 days.

(21) Appl. No.: 18/258,247

(22) PCT Filed: Dec. 31, 2020

(86) PCT No.: PCT/CN2020/142444
§ 371 (c)(1),
(2) Date: Jun. 19, 2023

(87) PCT Pub. No.: WO2022/134195
PCT Pub. Date: Jun. 30, 2022

(65) Prior Publication Data
US 2024/0039508 A1     Feb. 1, 2024

(30) Foreign Application Priority Data

Dec. 23, 2020 (CN) .......... 202011536833.1
Dec. 23, 2020 (CN) .......... 202011540661.5

(51) Int. Cl.
H03H 9/02     (2006.01)
H03H 3/08     (2006.01)
H03H 9/25     (2006.01)

(52) U.S. Cl.
CPC .......... *H03H 9/02818* (2013.01); *H03H 3/08* (2013.01); *H03H 9/25* (2013.01)

(58) Field of Classification Search
CPC .......... H03H 9/02818; H03H 3/08; H03H 9/25
(Continued)

(56) References Cited

U.S. PATENT DOCUMENTS

| | | |
|---|---|---|
| 2013/0249647 A1 | 9/2013 | Nakanishi et al. |
| 2016/0182008 A1 | 6/2016 | Bhattacharjee |

(Continued)

FOREIGN PATENT DOCUMENTS

| | | |
|---|---|---|
| CN | 109004914 A | 12/2018 |
| CN | 111200417 A | 5/2020 |

(Continued)

OTHER PUBLICATIONS

OA for CN application 202011536833.1.
(Continued)

*Primary Examiner* — Andrea Lindgren Baltzell
*Assistant Examiner* — Victor Cole
(74) *Attorney, Agent, or Firm* — Maginot, Moore & Beck, LLP

(57) ABSTRACT

A surface acoustic wave resonator and a manufacturing method thereof are provided. The surface acoustic wave resonator includes a piezoelectric substrate, an interdigital transducer located on a surface of the piezoelectric substrate, and a suppression layer for suppressing a transverse mode arranged on at least one of the piezoelectric substrate and the interdigital transducer.

2 Claims, 12 Drawing Sheets

(58) Field of Classification Search
USPC .................. 310/313 R, 346; 333/193, 194
See application file for complete search history.

(56) References Cited

U.S. PATENT DOCUMENTS

2019/0334500 A1* 10/2019 Horikawa .......... H03H 9/02574
2021/0408995 A1* 12/2021 Okunaga ............ H03H 9/02574
2022/0360249 A1* 11/2022 Ballandras ......... H03H 9/02881

FOREIGN PATENT DOCUMENTS

CN      111919384 A      11/2020
CN      111989862 A      11/2020

OTHER PUBLICATIONS

English translation of OA for CN application 202011536833.1.
OA for CN application 202011540661.5.
English translation of OA for CN application 202011540661.5.
ISR for PCT application PCT/CN2020/142444.
English translation of ISR for PCT application PCT/CN2020/142444.

* cited by examiner

SURFACE ACOUSTIC WAVE RESONATOR AND MANUFACTURING METHOD THEREFOR

CROSS-REFERENCE TO RELATED APPLICATIONS

The present application is a national phase entry under 35 USC § 371 of International Application No. PCT/CN2020/142444, filed on Dec. 31, 2020, which claims the benefit of and priority to Chinese Application Nos. 202011540661.5 and 202011536833.1, filed on Dec. 23, 2020, the entire disclosures of which are incorporated herein by reference.

FIELD

The present disclosure relates to a field of microelectronic devices, in particular to a field of surface acoustic waves, and more particularly to a surface acoustic wave resonator and a manufacturing method thereof.

BACKGROUND

SAW (surface acoustic wave), i.e. a surface acoustic wave, is an elastic wave that is generated and propagated on a surface of a piezoelectric substrate material, and whose amplitude decreases rapidly as a depth by which the surface acoustic wave enters the substrate material increases. A SAW resonator means to fabricate an interdigital transducer (IDT) on a polished surface of the substrate material with piezoelectric properties. However, the inventor of the present disclosure realizes that there is a strong transverse mode in a surface acoustic wave device in the related art, which, in terms of the performance of the device, will cause violent fluctuations between passbands and adversely affect the performance of the device.

It should be noted that the description of the background of the present disclosure does not constitute the prior art of the present disclosure, and does not constitute a limitation on the application scope of the present disclosure. For example, the present disclosure may be applied not only to the field of mobile communication, but also to other fields that require radio frequency, such as WIFI.

SUMMARY

A surface acoustic wave resonator according to embodiments of an aspect of the present disclosure includes a piezoelectric substrate, an interdigital transducer, and a suppression layer for suppressing a transverse mode, the interdigital transducer is arranged on a surface of the piezoelectric substrate, and the suppression layer is arranged on at least one of the piezoelectric substrate and the interdigital transducer.

A method for manufacturing a surface acoustic wave resonator according to embodiments of another aspect of the present disclosure includes: providing a piezoelectric substrate; fabricating an interdigital transducer on the piezoelectric substrate; forming a suppression layer for suppressing a transverse mode on at least one of the piezoelectric substrate and the interdigital transducer.

DETAILED DESCRIPTION

Figure 1A:
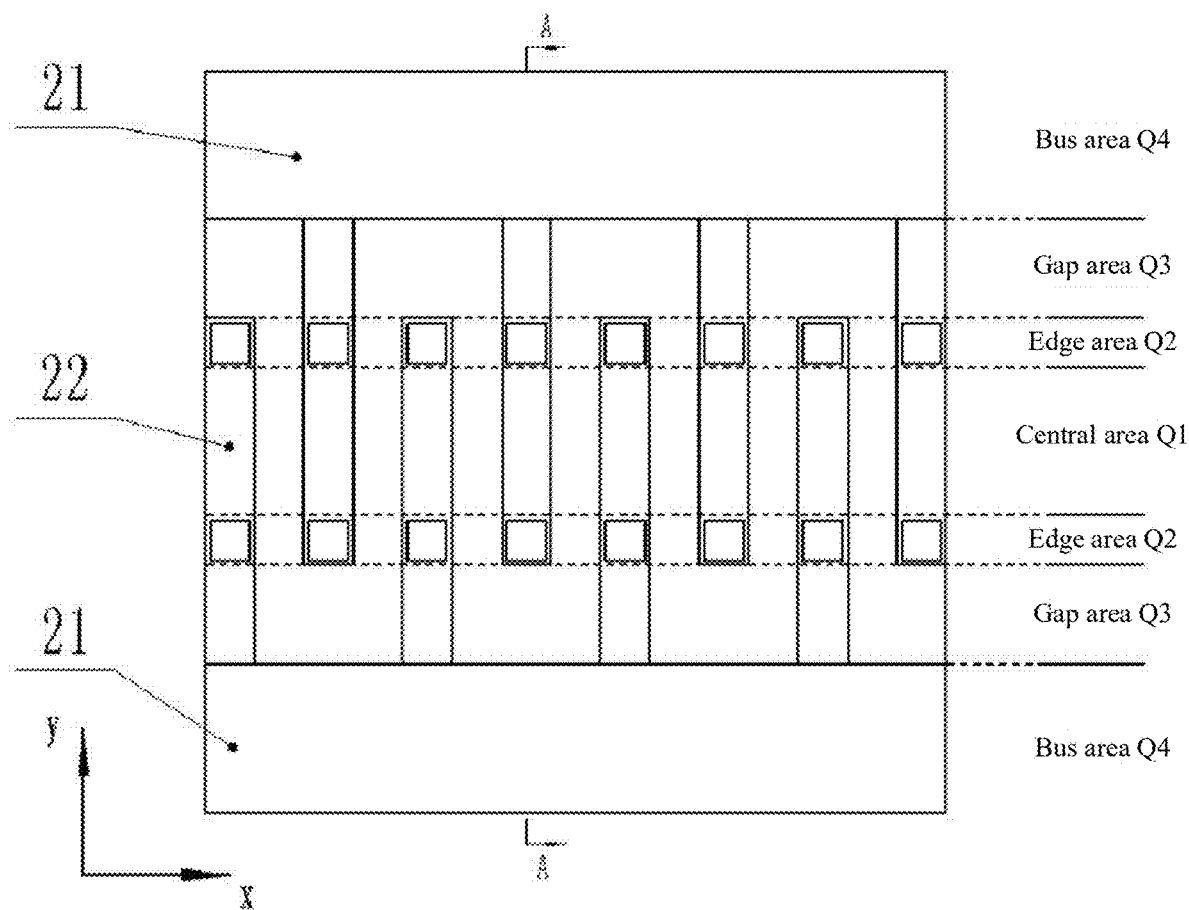
FIG. 1A is a schematic view of a surface acoustic wave device in the related art.

The present disclosure will be described herein with reference to drawings and embodiments in order to make the purpose, technical solution and advantages of the present disclosure more clear. It should be understood that the embodiments described herein are only part of the embodiments of the present disclosure, rather than the entire embodiments. In case of no conflict, the features in the following embodiments can be combined with each other. It should be understood that the specific embodiments described herein are only used to explain the present disclosure, and are not used to limit the present disclosure.

The terms used in the present disclosure are merely intended to describe the specific embodiments, and shall not be construed to limit the present disclosure. It should be understood that the terms such as "central", "longitudinal", "lateral", "length", "width", "thickness", "up", "down", "front", "rear", "right", "left", "horizontal", "vertical", "top", "bottom" "inner", "outer", "clockwise", "anticlockwise" etc. should be construed to refer to the orientation or position as shown in the drawings, merely for facilitating and simplifying the description of the present disclosure, and do not indicate or imply that the device or element referred to must have a particular orientation or must be constructed or operated in a particular orientation. Therefore, these terms should not be construed as a limitation to the present disclosure. In addition, the terms "first" and "second" are only used for purpose of description, and should not be construed as indicating or implying relative importance or implying the number of indicated technical features. Thus, a feature defined by "first" or "second" may expressly or implicitly include one or more of this feature. In the description of the present disclosure, "plurality" means two or more, unless otherwise expressly and specifically defined.

In the description of the present disclosure, it should be understood that, unless specified or defined otherwise, the terms "mount", "join", "connect" should be used broadly. For example, it may be a fixed connection, may also be a detachable connection, or an integrated connection; it may be a mechanical connection or an electrical connection; it may be a direct connection, may also be an indirect connection through an intermediate medium, or may be an internal communication of two elements or an interaction of two elements. For those skilled in the art, the specific meanings of the above terms in the present disclosure can be understood according to the specific circumstances.

In the present disclosure, unless otherwise specified and defined, a structure in which a first feature is "on" or "under" a second feature may include an embodiment in which the first feature directly contacts the second feature, and may also include an embodiment in which the first feature and the second feature do not directly contact each other, but through an additional feature therebetween. Furthermore, the first feature "on", "above", or "on top of" the second feature may include an embodiment in which the first feature is right "on", "above", or "on top of" the second feature, and may also include an embodiment in which the first feature is not right "on", "above", or "on top of" the second feature, or just means that the first feature is at a height higher than that of the second feature. The first feature "beneath", "below", or "on bottom of" the second feature may include an embodiment in which the first feature is right "beneath", "below", or "on bottom of" the second feature, and may also include an embodiment in which the first feature is not right "beneath", "below", or "on bottom of" the second feature, or just means that the first feature is at a height lower than that of the second feature. Illustrative embodiments of the present disclosure will be described in detail with reference to the accompanying drawings. In the case of no conflict, the features in the following embodiments and implementations may be complemented or combined with each other.

The terms used in the present disclosure are for the purpose of describing specific embodiments only and are not intended to limit the present disclosure. The singular forms "a", "said" and "the" used in the present disclosure and the appended claims are also intended to include the plural forms, unless the context clearly indicates other meaning.

The inventors of the present disclosure realized that, in the surface acoustic wave resonator in the related art, the measures for suppressing the harmful transverse mode mainly include the apodization technology and the adoption of the piston structure. The apodization technology refers to the non-uniform lengths of electrodes or dummy fingers, then the piston structure arises.

Figure 1B:
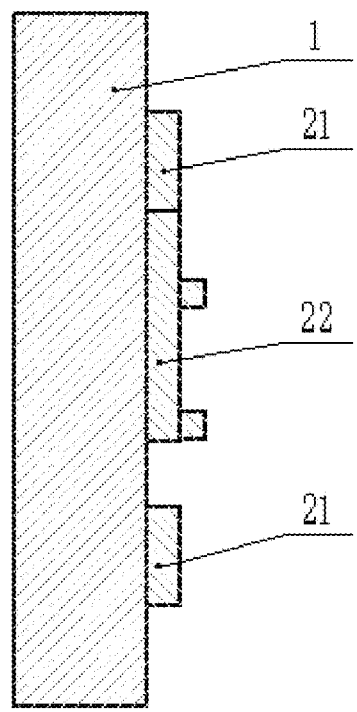
FIG. 1B is a cross-sectional view taken along line A-A in FIG. 1A.

The so-called piston structure refers to thickening or widening part of the areas at both ends of the electrode to slow down the sound velocity, which is matched between the connecting areas (high sound velocity areas) of the bus bars, so as to attenuate the transverse mode. FIGS. 1A and 1B illustrate a piston structure in the related art, in which a layer of weighted structure is arranged above an edge area of an electrode 22.

However, the inventors of the present disclosure have found and realized through research that the piston structure used in the related art either adjusts the width and thickness of the electrode when making the interdigital transducer, or arranges various weighted structures on the electrode, so as to change the sound velocity by changing the mass distribution. These processes are complicated, and the plate making and photolithography processes are difficult and costly.

In view of this, embodiments of the present disclosure propose a surface acoustic wave resonator capable of attenuating a harmful transverse mode to a certain extent.

The surface acoustic wave resonator according to the embodiments of the present disclosure includes a piezoelectric substrate 1, an interdigital transducer 2, and a suppression layer for suppressing the transverse mode. The interdigital transducer 2 is located on a surface of the piezoelectric substrate 1, and the suppression layer is arranged on at least one of the piezoelectric substrate 1 and the interdigital transducer 2.

The suppression layer is used for suppressing the transverse mode, and the suppression layer may be arranged only on the piezoelectric substrate 1 or the interdigital transducer 2, or may be arranged on both the piezoelectric substrate 1 and the interdigital transducer 2.

The surface acoustic wave resonator according to the embodiments of the present disclosure can attenuate the harmful transverse mode by arranging the suppression layer on the at least one of the piezoelectric substrate 1 and the interdigital transducer 2, has a simple structure, is easy to manufacture, and has high practicability.

In some embodiments, the piezoelectric substrate 1 has a recessed portion 11, and the suppression layer is formed as a deceleration layer (also referred to as a thickening layer) 5 filling the recessed portion 11. The deceleration layer 5 is in contact with an electrode 22 of the interdigital transducer 2 to reduce a sound velocity in an area where a contact position of the deceleration layer 5 and the electrode 22 is located. The interdigital transducer 2 has a central area Q1 and a non-central area, and the contact position is located in the non-central area.

The interdigital transducer 2 generally includes two bus bars 21 arranged opposite to each other, and finger-shaped electrodes 22 alternately arranged on the two bus bars 21 in a longitudinal direction (an X direction). An intersection of adjacent electrodes 22 serves as an acoustic aperture, and the acoustic aperture includes a central area Q1 (which is the same with the central area Q1 of the interdigital transducer 2, as shown in FIG. 1A) at a center of the acoustic aperture and an edge area Q2 (as shown in FIG. 1A) at an edge of the acoustic aperture. In addition to the edge area Q2, the non-central area also includes a gap area Q3.

The gap area Q3 refers to an area between a free end of the electrode 22 connected to one bus bar 21 and the opposite bus bar 21. The purpose of the arrangement of the deceleration layer 5 is to reduce the sound velocity in the area where the deceleration layer 5 is arranged, so as to suppress the transverse mode. The deceleration layer 5 is in contact with each electrode 22. The solution of this embodiment is also applicable to a surface acoustic wave resonator with a covering layer (such as a temperature compensation layer), so that the suppression of the transverse mode can be achieved without providing a deceleration structure on the covering layer.

The inventor of the present disclosure proposes a technical concept that is different from the related art. By changing the deceleration layer arranged on the electrode 22 in the related art to the deceleration layer arranged in the recessed portion 11 of the piezoelectric substrate 1 and located below the electrode 22, the effect of attenuating the harmful transverse mode is achieved. Further, since the deceleration layer 5 is arranged in the recessed portion 11 of the piezoelectric substrate 1 in this embodiment, the problem of attenuating the transverse mode does not need to be considered in a subsequent process, i.e. there is no need to make a complex weighted structure on the electrode 22, and there is no need to perform a special treatment on the width and thickness of the electrode 22, which, compared with the related art, reduces the difficulty and complexity of the manufacturing process, and saves the cost effectively.

In some embodiments, as shown in FIGS. 2A, 2B, 4A and 4B, the deceleration layer 5 is a metal layer, which is discontinuously distributed along the longitudinal direction (the X direction). For example, a plurality of deceleration layers 5 are arranged and spaced apart from each other in the X direction, and have a one-to-one correspondence with the electrodes 22. Accordingly, a plurality of recessed portions 11 are also arranged and have a one-to-one correspondence with the plurality of deceleration layers 5.

The metal layer may be made of Cu, or may be made of metals such as Al, Au, Pt, or an alloy formed by a combination of the above metals. When the deceleration layer 5 is the metal layer, considering that the electrodes 22 should not communicate with each other, the metal layers are discontinuously arranged below positions of the respective electrodes 22 and individually in contact with the respective electrodes 22, respectively. Correspondingly, the recessed portions 11 may be blind holes arranged below the corresponding positions of the multiple electrodes 22, respectively.

Figure 2A:
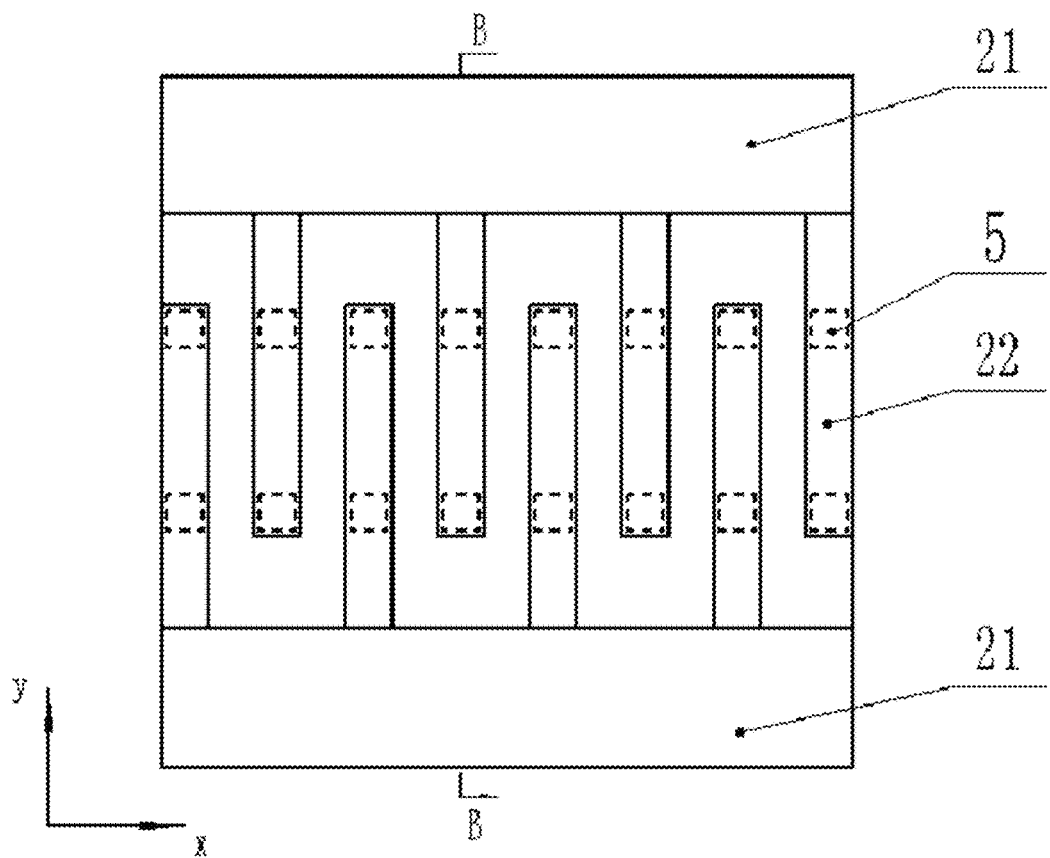
FIG. 2A is schematic view of a surface acoustic wave resonator according to a first embodiment of the present disclosure.
Figure 2B:
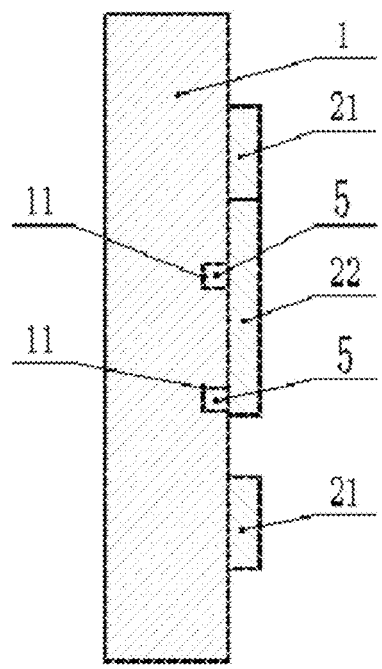
FIG. 2B is a cross-sectional view taken along line B-B in FIG. 2A.
Figure 4A:
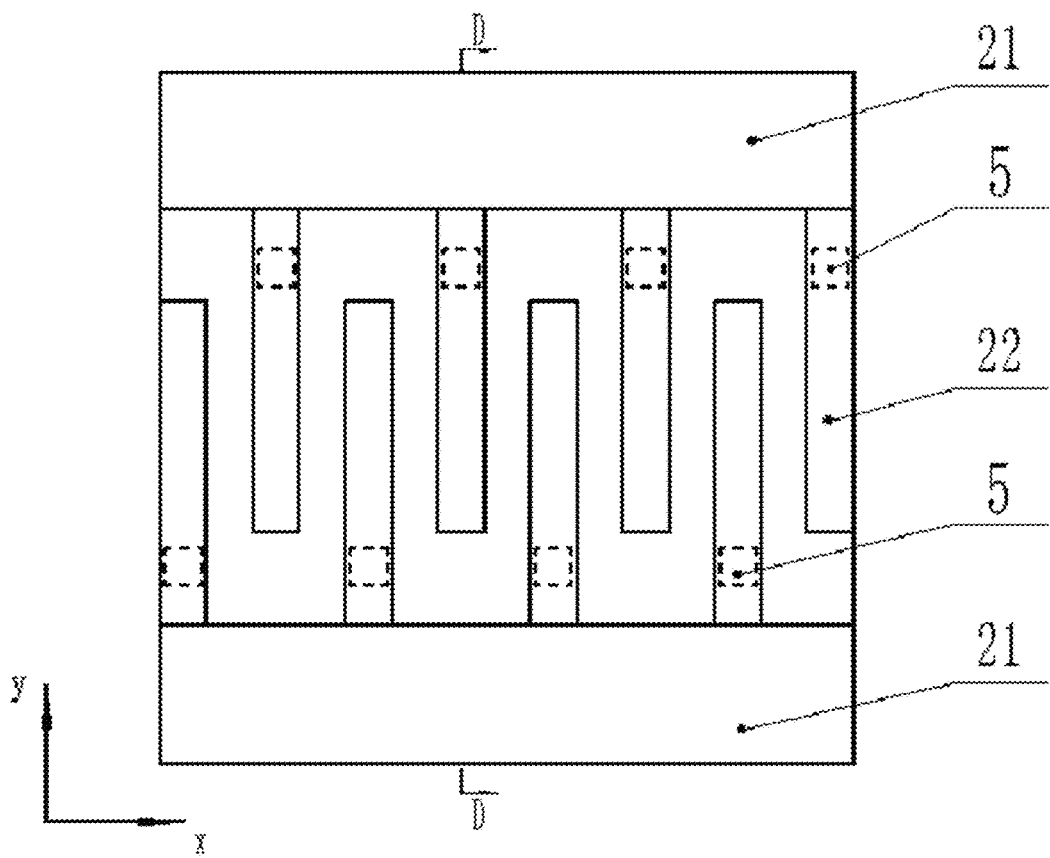
FIG. 4A is a schematic view of a surface acoustic wave resonator according to a third embodiment of the present disclosure.
Figure 4B:
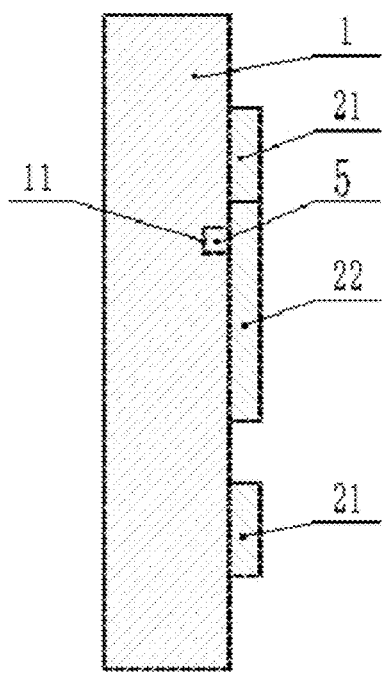
FIG. 4B is a cross-sectional view taken along line D-D in FIG. 4A.

In some embodiments, the deceleration layer 5 is completely covered by the electrode 22. As shown in FIGS. 2A and 4A, a width of the deceleration layer 5 is not greater than the width of the electrode 22, so that the electrode 22 can completely cover the metal layer. Of course, the width of the deceleration layer 5 may also be larger than the width of the electrode 22.

In some embodiments, as shown in FIGS. 2A-5B, the deceleration layer 5 is a dielectric layer which is distributed continuously or discontinuously in the longitudinal direction (the X direction).

Figure 3A:
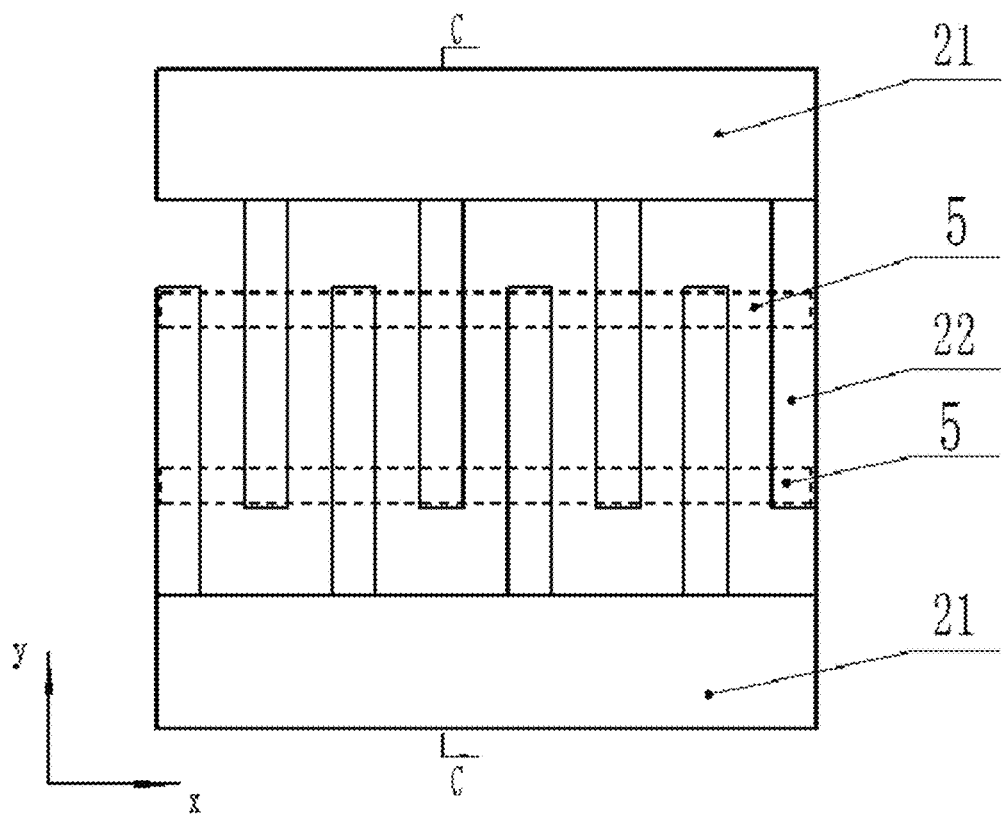
FIG. 3A is a schematic view of a surface acoustic wave resonator according to a second embodiment of the present disclosure.
Figure 3B:
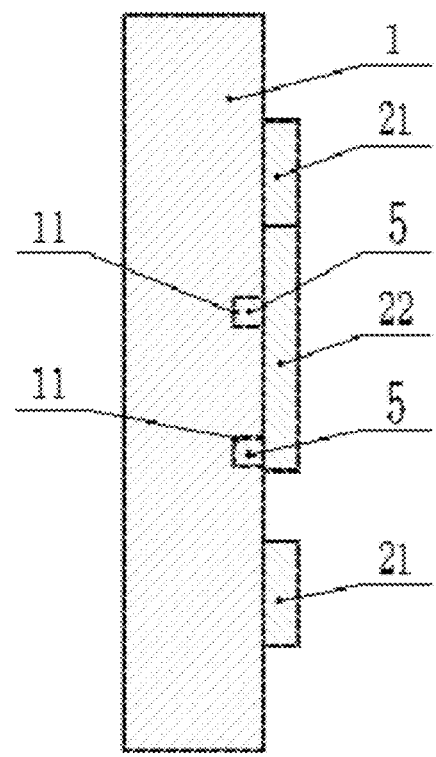
FIG. 3B is a cross-sectional view taken along line C-C in FIG. 3A.
Figure 5A:
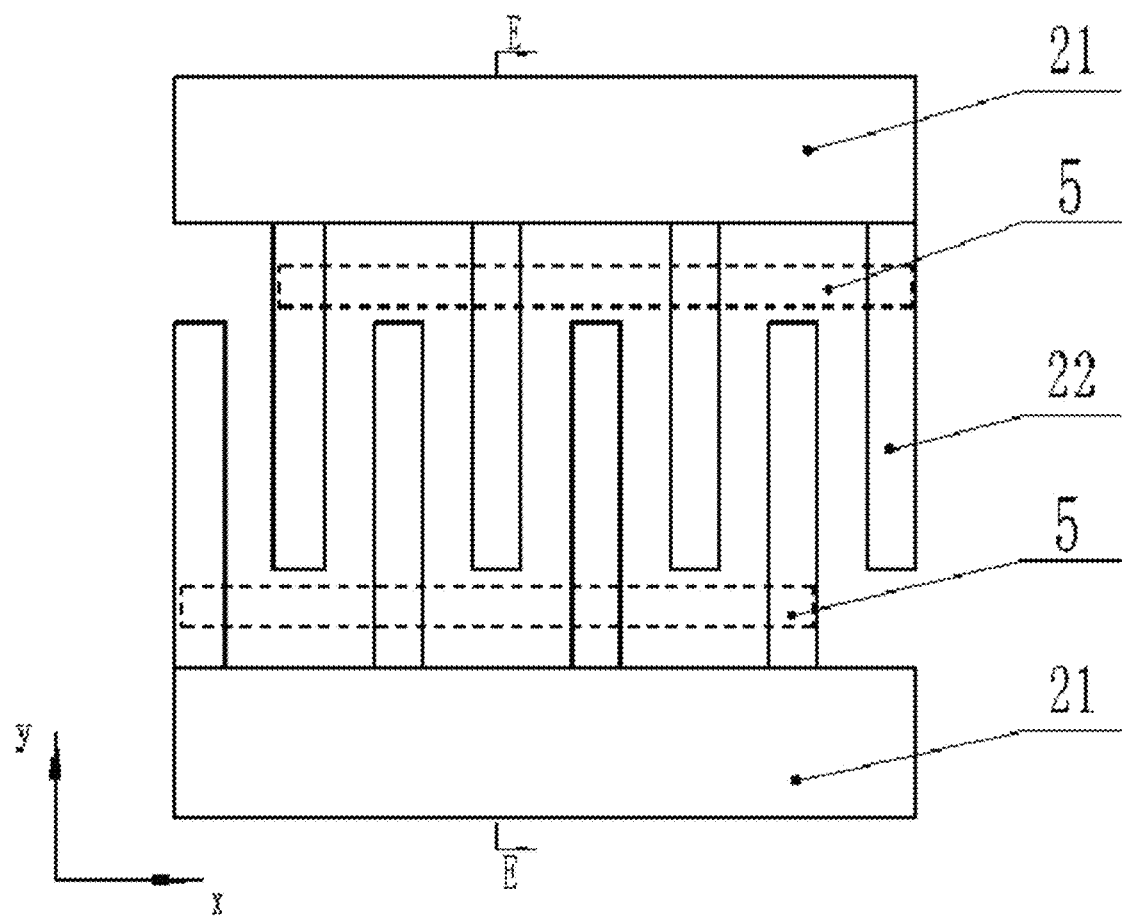
FIG. 5A is a schematic view of a surface acoustic wave resonator according to a fourth embodiment of the present disclosure.
Figure 5B:
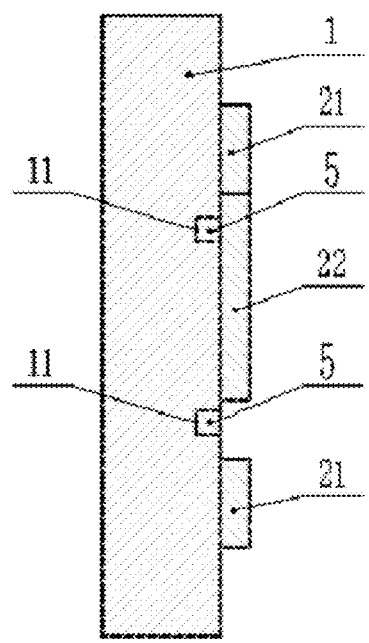
FIG. 5B is a cross-sectional view taken along line E-E in FIG. 5A.

The dielectric layer may be made of silicon dioxide, zinc oxide and other materials. When the deceleration layers 5 are the dielectric layers, the recessed portions 11 may be the blind holes arranged below the corresponding positions of the electrodes 22, and the dielectric layers may be discontinuously arranged below the positions of the respective electrodes 22 and individually in contact with the respective electrodes 22, respectively. In some embodiments, as shown in FIGS. 3A and 5A, the recessed portion 11 may also be a strip-shaped groove that is arranged below the electrodes 22 and communicates the electrodes 22 along the longitudinal direction. In this case, the dielectric layer may also have a strip shape, be received in the strip-shaped recessed portion 11 and be arranged below the positions of the electrodes 22 and be in contact with the multiple electrodes 22.

In some embodiments, as shown in FIGS. 2A, 2B, 3A and 3B, the non-central area includes the edge area Q2 and the gap area Q3 at an outer side the edge area Q2 along a transverse direction, and the contact position is located in the edge area Q2.

In some embodiments, the contact positions of the electrodes 22 connected to the same bus bar 21 are arranged in a straight line along the longitudinal direction (the X direction).

In some embodiments, as shown in FIGS. 4A, 4B, 5A and 5B, the non-central area includes the edge area Q2 and the gap area Q3 at an outer side of the edge area Q2 along the transverse direction, and the contact position is located in the gap area Q3.

In some embodiments, the contact positions of the electrodes 22 connected to the same bus bar 21 are arranged in a straight line along the longitudinal direction (the X direction).

In addition, the contact positions may also be arranged in the edge area Q2 and the gap area Q3 at the same time, which may be connected together or arranged at intervals.

In some embodiments, a depth of the recessed portion 11 is 5%-15% of a period of the interdigital transducer 2.

In other embodiments, the interdigital transducer 2 of the surface acoustic wave resonator has a central area Q1, a non-central area and a bus area Q4, and the bus area Q4 is located on either outer side of the central area Q1 in the transverse direction (a Y direction). The non-central area is located between the central area Q1 and the bus area Q4 in the transverse direction. The suppression layer includes a first temperature compensation layer 3 and a second temperature compensation layer 4, and the sound velocity in the first temperature compensation layer 3 is lower than the sound velocity in the second temperature compensation layer 4. The first temperature compensation layer 3 covers at least a part of the non-central area, and the second temperature compensation layer 4 covers a part of the interdigital transducer 2 located on an outer side of the first temperature compensation layer 3 in the transverse direction and a part of the interdigital transducer 2 located between the outermost first temperature compensation layers 3 in the transverse direction.

The first temperature compensation layer 3 may be arranged in the edge area Q2 or the gap area Q3, or may be arranged in at least parts of the edge area Q2 and the gap area Q3 at the same time. The first temperature compensation layer 3 and the second temperature compensation layer 4 are made of a material with a positive temperature coefficient (such as polysilicon or metal oxide or other materials with a positive temperature coefficient), so as to compensate negative temperature coefficients of the piezoelectric substrate 1 and the electrode conductive material to a certain extent.

In order to suppress the transverse mode, the first temperature compensation layer 3 uses a material with a low sound velocity (such as borosilicate or other media with a low shear wave velocity), and the second temperature compensation layer 4 uses a material with a high sound velocity (such as $SiO_2$ or ZnO, and so on). On the interdigital transducer 2, the outer side refers to a side facing the bus area Q4. In particular, a height of the first temperature compensation layer 3 may be different from a height of the second temperature compensation layer 4. In some embodiments, the height of the first temperature compensation layer 3 is not greater than the height of the second temperature compensation layer 4. Further, the height of the first temperature compensation layer 3 is smaller than the height of the second temperature compensation layer 4 (including a case that the first temperature compensation layer 3 is covered by the second temperature compensation layer 4).

According to the surface acoustic wave resonator of this embodiment, the temperature compensation layers made by using the materials which have the positive temperature coefficients and different sound velocities are arranged on the interdigital transducer 2 in different areas, at least a partial area of the interdigital transducer 2 between the central area Q1 and the bus area Q4 on either side is covered with the temperature compensation layer with the low sound velocity, and other areas of the interdigital transducer 2 are covered with the temperature compensation layer with the high sound velocity, so that the transverse mode can be suppressed without specially providing the weighted structure or the piston structure.

The embodiments of the present disclosure propose a technical concept that is different from the related art, which can not only realize the regulation and control of the speed velocity, but also solve the problems of the re-engraving offset in the piston process and the reduction of the gap between the electrodes 22 to a certain extent, thus significantly decreasing the process requirements.

A surface acoustic wave resonator according to a specific embodiment of the present disclosure will be described below with reference to the accompanying drawings.

Figure 6A:
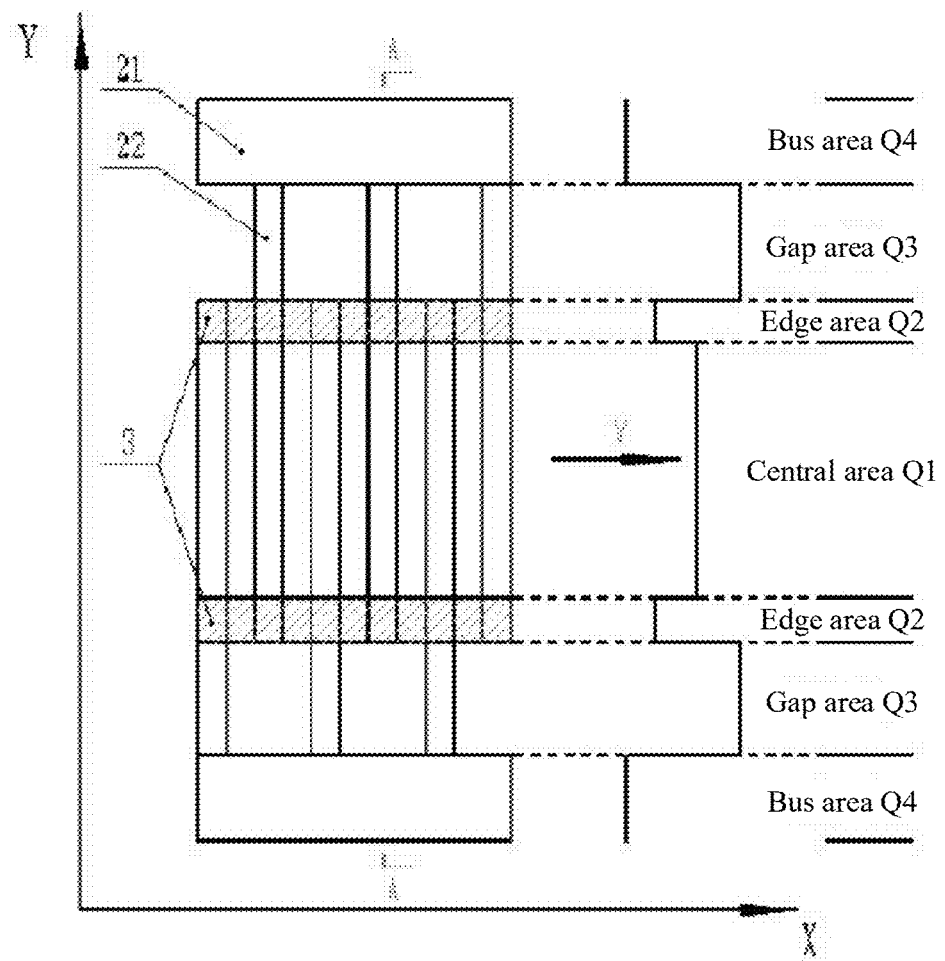
FIG. 6A is a schematic view of a surface acoustic wave resonator according to a fifth embodiment of the present disclosure.
Figure 6B:
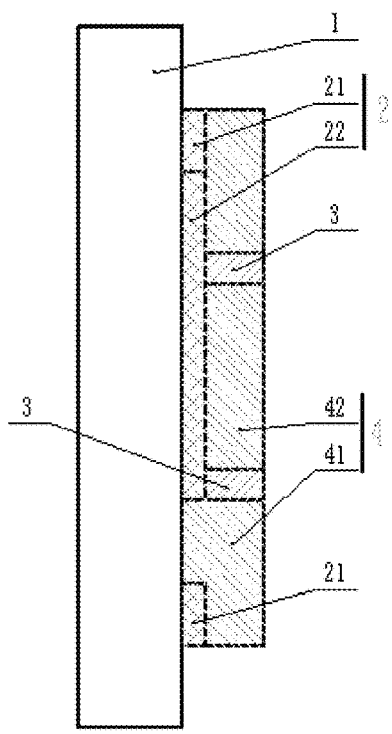
FIG. 6B is a cross-sectional view taken along line F-F in FIG. 6A.

As shown in FIGS. 6A and 6B, the surface acoustic wave resonator includes a piezoelectric substrate 1 and an interdigital transducer 2 located on a surface of the piezoelectric substrate 1. An edge area Q2 of the interdigital transducer 2 on either side is covered with a first temperature compensation layer 3, and a central area Q1, a bus area Q4 and a gap area Q3 of the interdigital transducer 2 are covered with a second temperature compensation layer 4. The sound velocity in the first temperature compensation layer 3 is lower than the sound velocity in the second temperature compensation layer 4.

Further, the second temperature compensation layer 4 includes an outer compensation layer 41 and an inner compensation layer 42 with different sound velocities (both of which have higher sound velocities than the first temperature compensation layer 3), and the outer compensation layer 41 covers the bus area Q4 and the gap area Q3, and the inner compensation layer 42 covers the central area Q1.

By dividing the second temperature compensation layer 4 into the outer compensation layer 41 and the inner compensation layer 42 having different sound velocities, the effect of suppressing the transverse mode can be further improved. Specifically, the sound velocity in the outer compensation layer 41 may be higher than the sound velocity in the inner compensation layer 42.

Hereinafter, a surface acoustic wave resonator according to another specific embodiment of the present disclosure will be described with reference to the accompanying drawings.

Figure 7A:
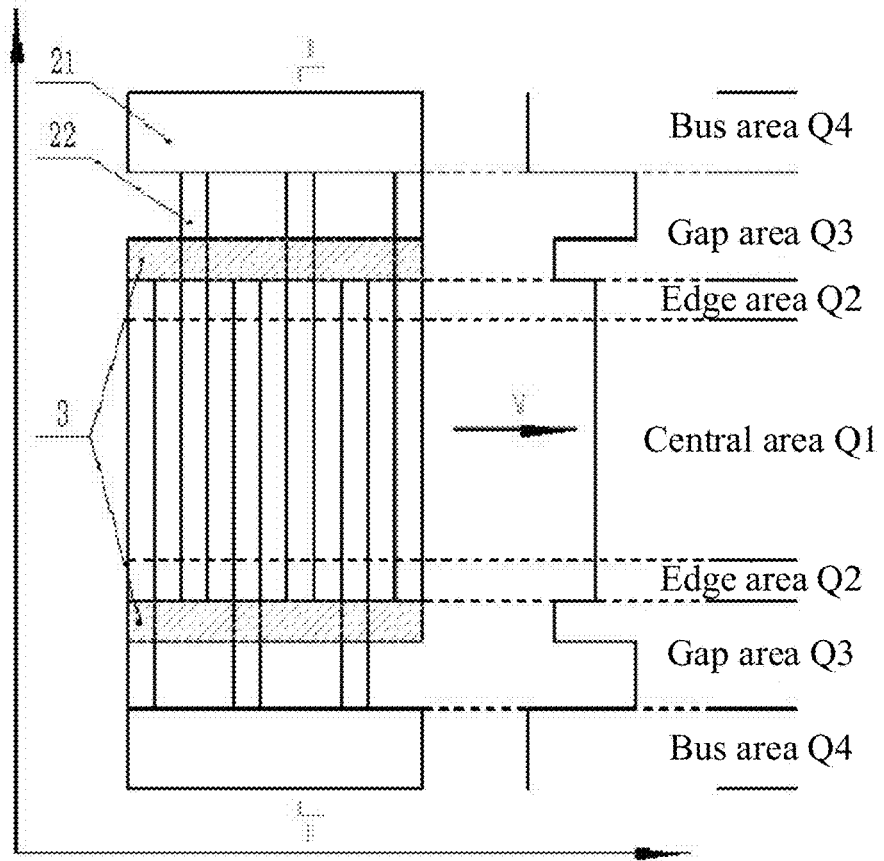
FIG. 7A is a schematic view of a surface acoustic wave resonator according to a sixth embodiment of the present disclosure.
Figure 7B:
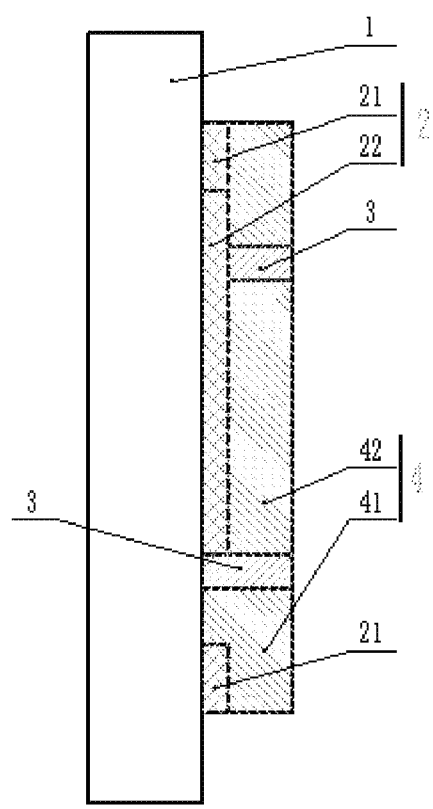
FIG. 7B is a cross-sectional view of the surface acoustic wave resonator shown in FIG. 7A.

As shown in FIGS. 7A and 7B, the surface acoustic wave resonator for suppressing the transverse mode includes a piezoelectric substrate 1 and an interdigital transducer 2 located on a surface of the piezoelectric substrate 1. A gap area Q3 of the interdigital transducer 2 on either side is covered with a first temperature compensation layer 3, and the interdigital transducer 2 is covered with a second temperature compensation layer 4 on an outer side of the first temperature compensation layer 3 and in a central area Q1 and an edge area Q2. The sound velocity in the first temperature compensation layer 3 is lower than the sound velocity in the second temperature compensation layer 4.

Further, the second temperature compensation layer 4 includes an outer compensation layer 41 and an inner compensation layer 42 with different sound velocities (both of which have sound velocities higher than the first temperature compensation layer 3), the outer compensation layer 41 covers an area on the outer side of the first temperature compensation layer 3, and the inner compensation layer 42 covers the central area Q1 and the edge area Q2.

By dividing the second temperature compensation layer 4 into the outer compensation layer 41 and the inner compensation layer 42 having different sound velocities, the effect of suppressing the transverse mode can be further improved. Specifically, the sound velocity in the outer compensation layer 41 may be higher than the sound velocity in the inner compensation layer 42.

Hereinafter, a surface acoustic wave resonator according to still another specific embodiment of the present disclosure will be described with reference to the accompanying drawings.

Figure 8:
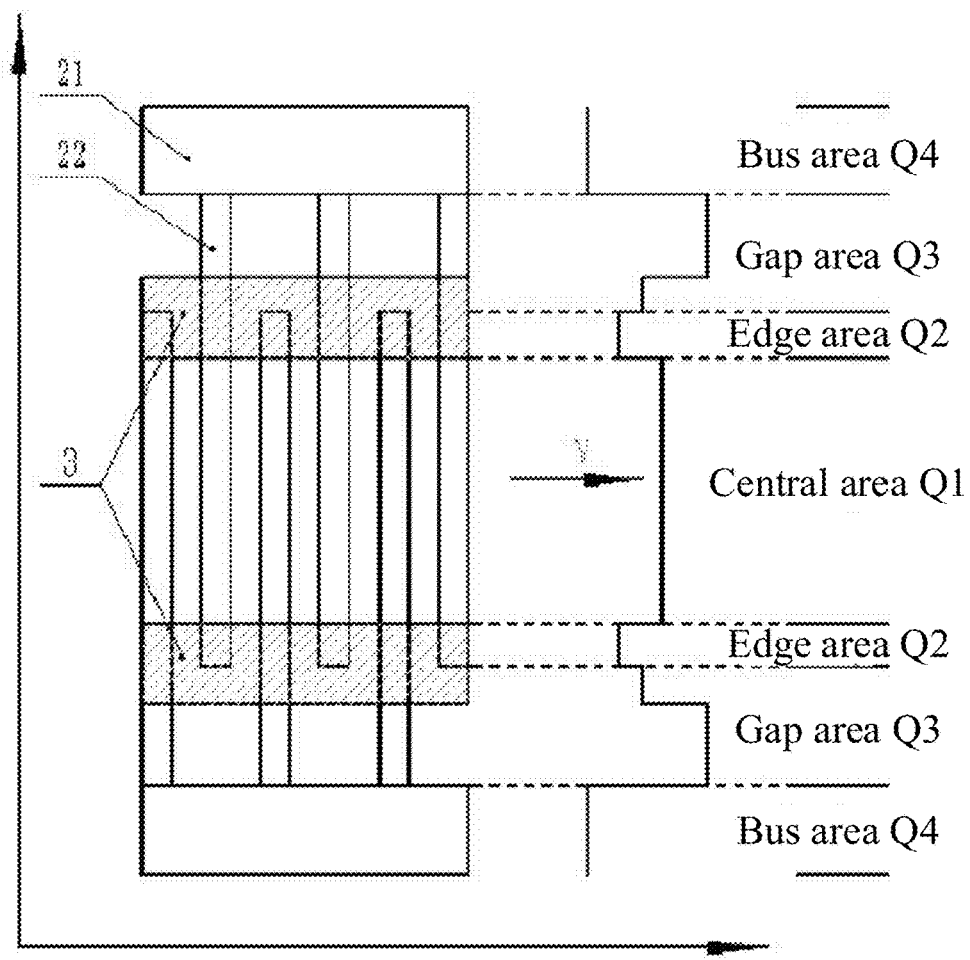
FIG. 8 is a schematic view of a surface acoustic wave resonator according to a seventh embodiment of the present disclosure.

As shown in FIG. 8, the surface acoustic wave resonator for suppressing the transverse mode includes a piezoelectric substrate 1 and an interdigital transducer 2 located on a surface of the piezoelectric substrate 1. At least parts of a gap area Q3 and an edge area Q2 of the interdigital transducer 2 on either side are covered with a first temperature compensation layer 3, and the interdigital transducer 2 is covered with a second temperature compensation layer 4 on an outer side of the first temperature compensation layer 3 (or, parts of a bus area Q4, the gap area Q3 and the edge area Q2 not covered with the first temperature compensation layer 3) and in a central area Q1. The sound velocity in the first temperature compensation layer 3 is lower than the sound velocity in the second temperature compensation layer 4.

Further, the second temperature compensation layer 4 includes an outer compensation layer 41 and an inner compensation layer 42 with different sound velocities (both of which have higher sound velocities than the first temperature compensation layer 3), the outer compensation layer 41 is used to cover the parts of the bus area Q4, the gap area Q3 and the edge area Q2 not covered with the first temperature compensation layer 3, and the inner compensation layer 42 covers the central area Q1.

By dividing the second temperature compensation layer 4 into the outer compensation layer 41 and the inner compensation layer 42 having different sound velocities, the effect of suppressing the transverse mode can be further improved. Specifically, the speed velocity in the outer compensation layer 41 may be higher than the sound velocity in the inner compensation layer 42.

A method for manufacturing a surface acoustic wave resonator according to an embodiment of the present disclosure is described below.

The method for manufacturing the surface acoustic wave resonator according to the embodiment of the present disclosure includes: providing a piezoelectric substrate; fabricating an interdigital transducer on the piezoelectric substrate; and forming a suppression layer for suppressing a transverse mode on at least one of the piezoelectric substrate and the interdigital transducer.

According to the method for manufacturing the surface acoustic wave resonator in the embodiment of the present disclosure, by arranging the suppression layer on the at least one of the piezoelectric substrate and the interdigital transducer, the effect of attenuating the harmful transverse mode is achieved, and the manufacturing process is simple and has a high practicality.

In some embodiments, the method for manufacturing the surface acoustic wave resonator further includes forming a recessed portion 11 in the piezoelectric substrate 1, and filling the recessed portion 11 with a deceleration layer 5 of metal or dielectric materials, so that it is convenient for the acceleration layer 5 to form a suppression layer in the recessed portion 11.

Further, the interdigital transducer 2 has a central area Q1 and a non-central area, and an electrode 22 of the interdigital transducer 2 is in contact with the deceleration layer 5 in the non-central area, so that the deceleration layer 5 increases a thickness of the electrode 22 in contact therewith at a contact position of the deceleration layer 5 and the electrode 22.

The interdigital transducer 2 generally includes two bus bars 21 arranged opposite to each other, and finger-shaped electrodes 22 alternately and transversely arranged on the two bus bars 21 along a longitudinal direction (an X direction). An intersection of adjacent electrodes 22 is an acoustic aperture, and the acoustic aperture includes a central area Q1 located at a center of the acoustic aperture and an edge area Q2 located at an edge of the acoustic aperture. The purpose of the arrangement of the deceleration layer 5 is to reduce the speed velocity in the area where the deceleration layer 5 is arranged, so as to suppress the transverse mode.

The recessed portion 11 may be fabricated by a laser etching method. The recessed portion 11 may have any suitable shape, such as a square shape, a circle shape or other polygon shapes. A depth of the recessed portion 11 may be set to be 5% to 15% of a period of the transducer. The material of the electrode 22 of the interdigital transducer 2 may be Cu, or may also be a metal such as Al, Au, Pt, or an alloy formed by a combination the above metals. The deceleration layer 5 can be made of metal, and advantageously, the same metal or alloy can be used as the electrode 22.

The difference between this embodiment and the related art is that, in the related art, the width and thickness of the electrode 22 is usually adjusted while the interdigital transducer 2 is fabricated on the piezoelectric substrate 1, or some materials are arranged on the electrode 22 after the interdigital transducer 2 is fabricated, so as to achieve different mass distributions, thus changing the sound velocity. In this embodiment, before the interdigital transducer 2 is fabricated, the recessed portion 11 is arranged in the piezoelectric substrate 1, the deceleration layer 5 is filled in the recessed portion 11, and then the interdigital transducer 2 is fabricated on the piezoelectric substrate 1 and the deceleration layer 5. By arranging the deceleration layer 5 in the area where the interdigital transducer 2 needs to decelerate the sound, the transverse mode can be effectively suppressed.

In some embodiments, the contact position is in the edge area Q2.

In some embodiments, the contact position is in the gap area Q3.

In some embodiments, the deceleration layer 5 is a metal layer.

The metal layer may be made of Cu, and also may be made of metals such as Al, Au, and Pt, or an alloy formed by a combination of at least a part of the above metals. The recessed portion 11 may be a blind hole arranged below the corresponding position of the electrode 22, and at this time, the metal layer may be arranged only below the position of the electrode 22 and in contact with the electrode 22.

In some embodiments, the deceleration layer 5 is a dielectric layer.

The recessed portion 11 may be a blind hole arranged below the corresponding position of the electrode 22, and at this time, the dielectric layer may be arranged only below the position of the electrode 22 and in contact with a single electrode 22. In some embodiments, the recessed portion 11 may be a strip-shaped groove that is arranged below the corresponding positions of the multiple electrodes 22 and communicates the multiple electrodes 22 along the longitudinal direction, and at this time, the dielectric layer may be arranged below the positions of the electrodes 22 and in contact with the multiple electrodes 22.

Figure 9:
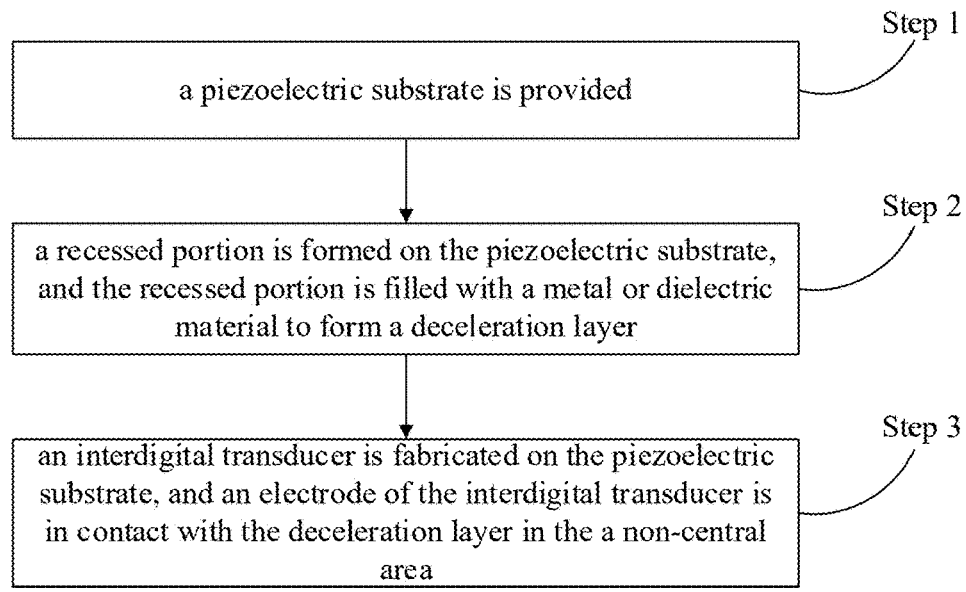
FIG. 9 is a flow chart of a method for manufacturing a surface acoustic wave resonator according to an embodiment of the present disclosure.

A method for manufacturing a surface acoustic wave resonator according to a specific embodiment of the present disclosure will be described below with reference to FIG. 9.

At step 1, a piezoelectric substrate 1 is provided.

At step 2, a recessed portion 11 is formed in the piezoelectric substrate 1, and the recessed portion 11 is filled with a metal or dielectric material to form a deceleration layer 5.

At step 3, an interdigital transducer 2 is fabricated on the piezoelectric substrate 1, and an electrode 22 of the interdigital transducer 2 is in contact with the deceleration layer 5 in a non-central area. The deceleration layer 5 can increase a thickness of the electrode 22 in contact therewith in a contact position of the deceleration layer 5 and the electrode 22.

In some embodiments, the interdigital transducer 2 has a central area Q1, a non-central area and a bus area Q4. The bus area Q4 is located at either outer side of the central area Q1 in a transverse direction, and the non-central area is located between the central area Q1 and the bus area Q4 in the transverse direction.

In some embodiments, forming a suppression layer (i.e. the deceleration layer 5) for suppressing the transverse mode includes: forming a first temperature compensation layer 3 and a second temperature compensation layer 4. The first temperature compensation layer 3 covers at least a part of the non-central area, and the second temperature compensation layer 4 covers a part of the interdigital transducer 2 at an outer side of the temperature compensation layer 3 in the transverse direction, and a part of the interdigital transducer 2 between the outermost first temperature compensation layers 3 in the transverse direction.

In some embodiments, the sound velocity in the first temperature compensation layer 3 is lower than the sound velocity in the second temperature compensation layer 4, and the second temperature compensation layer 4 includes an outer compensation layer 41 located at the outer side of the first temperature compensation layer 3 and an inner compensation layer 42 between the first temperature compensation layers 3. The sound velocity in the inner compensation layer 42 is different from the sound velocity in the outer compensation layer 41.

Figure 14:
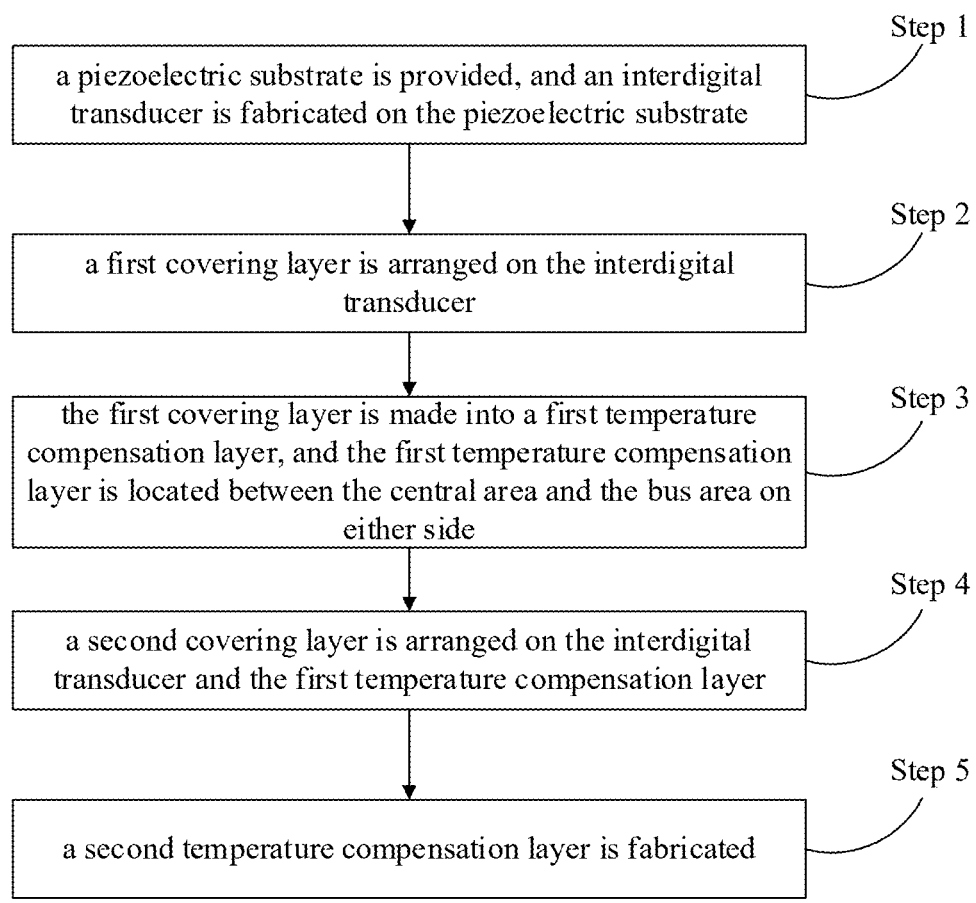
FIG. 14 is a flow chart of a method for manufacturing a surface acoustic wave resonator according to another embodiment of the present disclosure.

A method for manufacturing a surface acoustic wave resonator according to another specific embodiment of the present disclosure will be described below with reference to FIG. 14.

Figure 10:
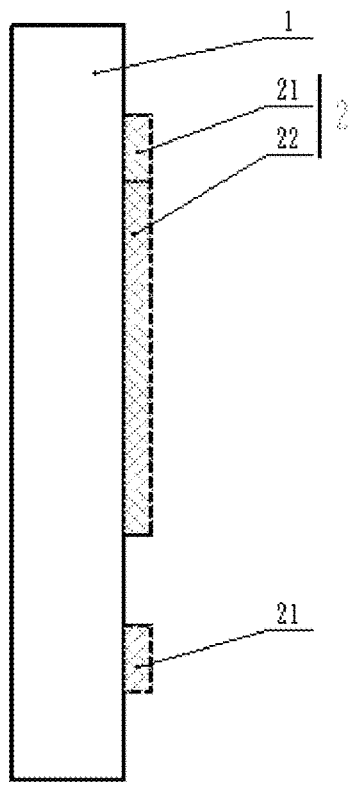
FIG. 10 shows a first example of a method of manufacturing a surface acoustic wave resonator according to an embodiment of the present disclosure.

At step 1, as shown in FIG. 10, a piezoelectric substrate 1 is provided, and an interdigital transducer 2 is fabricated on the piezoelectric substrate 1.

Figure 11:
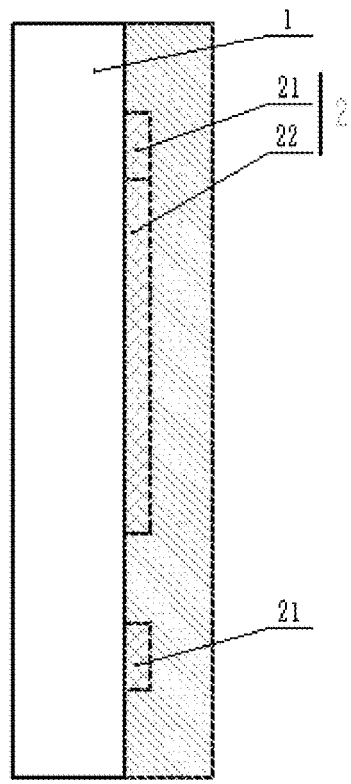
FIG. 11 shows a second example of a method of manufacturing a surface acoustic wave resonator according to an embodiment of the present disclosure.

At step 2, as shown in FIG. 11, a first covering layer is arranged on the interdigital transducer 2.

The first covering layer may be made of a material with a low sound velocity and a positive temperature coefficient, such as borosilicate or other media with a low shear wave velocity. The first covering layer may be arranged on the interdigital transducer 2 by means of physical vapor deposition.

Figure 12:
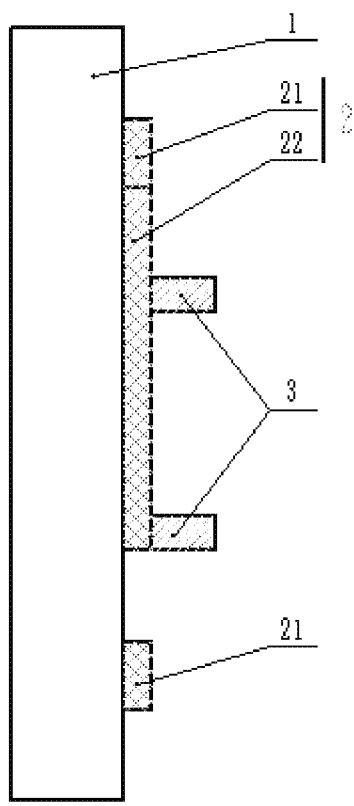
FIG. 12 shows a third example of a method of manufacturing a surface acoustic wave resonator according to an embodiment of the present disclosure.

At step 3, as shown in FIG. 12, the first covering layer is made into a first temperature compensation layer 3, and the first temperature compensation layer 3 is located between the central area Q1 and the bus area Q4 on either side.

An etching process may be used to retain a partial area of the first covering layer between the central area Q1 and the bus area Q4 on either side of the interdigital transducer 2 and remove other parts, so as to form the first temperature compensation layer 3.

Figure 13:
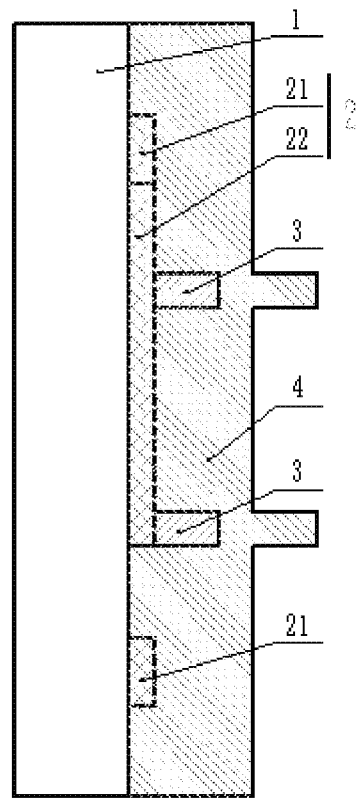
FIG. 13 shows a fourth example of a method of manufacturing a surface acoustic wave resonator according to an embodiment of the present disclosure.

At step 4, as shown in FIG. 13, a second covering layer is arranged on the interdigital transducer 2 and the first temperature compensation layer 3.

The second covering layer may be made of a material with a high sound velocity and a positive temperature coefficient, such as $SiO_2$, ZnO or other materials with a high shear wave velocity.

At step 5, as shown in FIG. 1B, a second temperature compensation layer 4 is fabricated and planarized. The second temperature compensation layer 4 covers at least the area of the interdigital transducer 2 that is not covered by the first temperature compensation layer 3.

The second covering layer may be directly made into the second temperature compensation layer 4. The second temperature compensation layer 4 includes an outer compensation layer 41 and an inner compensation layer 42, and at this time, the outer compensation layer 41 and the inner compensation layer 42 are made of the same material. The planarization treatment may employ a CMP (Chemical Mechanical Polishing) process.

In some embodiments, the method of fabricating the second temperature compensation layer 4 includes: making the second covering layer into one of the outer compensation layer 41 and the inner compensation layer 42; providing a third covering layer; and making the third covering layer into the inner compensation layer 42 or the outer compensation layer 41, and the sound velocities of the outer compensation layer 41 and the inner compensation layer 42 being different.

The outer compensation layer 41 is located at an outer side of the first temperature compensation layer 3, and the inner compensation layer 42 is located between the first temperature compensation layers 3 on both sides. If the outer compensation layer 41 and the inner compensation layer 42 are to be further made of different materials, the second covering layer may be made into the outer compensation layer 41 (or the inner compensation layer 42), then the third covering layer is covered on it, and then the third covering layer is made into the inner compensation layer 42 (or the outer compensation layer 41). In an embodiment, the sound velocity in the outer compensation layer 41 may be greater than the sound velocity in the inner compensation layer 42.

Compared with the related art, the surface acoustic wave resonator and the manufacturing method thereof according to the embodiments of the present disclosure have the following beneficial effects.

1. By changing the deceleration layer arranged on the electrode in the related art into the deceleration layer arranged in the recessed portion of the piezoelectric substrate and below the electrode, the effect of attenuating the harmful transverse mode is achieved.

2. By incorporating the deceleration layer into the recessed portion of the piezoelectric substrate, there is no need to consider the problem of attenuating the transverse mode in the subsequent process, that is, there is no need to make a complex weighted structure on the electrode, and also no need to perform the special treatment on the width and thickness of the electrode, reducing the difficulty and complexity of the process and effectively saving costs.

3. The temperature compensation layers made by using the materials which have the positive temperature coefficients and different sound velocities are arranged on the interdigital transducer 2 in different areas, at least a partial area of the interdigital transducer between the central area Q1 and the bus area Q4 on either side is covered with the temperature compensation layer with the low sound velocity, and other areas of the interdigital transducer are covered with the temperature compensation layer with the high sound velocity, so that the transverse mode can be suppressed without providing the weighted structure or the piston structure. The regulation and control of the speed velocity are realized, and also the problems of the re-engraving offset in the piston process and the reduction of the gap between the electrodes are solved to a certain extent, thus significantly decreasing the process requirements.

The above embodiments only represent several embodiments of the present disclosure, and the descriptions thereof are relatively specific and detailed, but should not be construed as limiting the scope of the present disclosure. It should be pointed out that for those skilled in the art, without departing from the concept of the present disclosure, several modifications and improvements can be made, which all belong to the protection scope of the present disclosure. Therefore, the protection scope of the present disclosure should be determined by the appended claims.

The invention claimed is:

1. A surface acoustic wave resonator, comprising a piezoelectric substrate, an interdigital transducer and a suppression layer for suppressing a transverse mode, wherein the interdigital transducer is arranged on a surface of the piezoelectric substrate, and the suppression layer is arranged on at least one of the piezoelectric substrate and the interdigital transducer, wherein the interdigital transducer has a central area, first and second non-central areas and first and second bus areas, the first and second bus areas are located on both outer sides of the central area in a transverse direction, respectively, the first non-central area is located between the central area and the first bus area in the transverse direction, the second non-central area is located between the central area and the second bus area in the transverse direction, the suppression layer comprises a two first temperature compensation layers and a second temperature compensation layer, a sound velocity in each of the two first temperature compensation layers is lower than a sound velocity in the second temperature compensation layer, one of the two first temperature compensation layers covers at least a part of the first non-central area, the other of the two first temperature compensation layers covers at least a part of the second non-central area, and the second temperature compensation layer covers a part of the interdigital transducer located on an outer side of each of the two first temperature compensation layers in the transverse direction and a part of the interdigital transducer located between the two first temperature compensation layers in the transverse direction; and wherein the second temperature compensation layer comprises an outer compensation layer and an inner compensation layer with different sound velocities, the outer compensation layer is located on the outer side of each of the two first temperature compensation layers, and the inner compensation layer is located between the two first temperature compensation layers.

2. A method for manufacturing a surface acoustic wave resonator, comprising:

providing a piezoelectric substrate;

fabricating an interdigital transducer on the piezoelectric substrate; and forming a suppression layer for suppressing a transverse mode on at least one of the piezoelectric substrate and the interdigital transducer, wherein the interdigital transducer has a central area, first and second non-central areas and first and second bus areas, the first and second bus areas are located on both outer sides of the central area in a transverse direction, respectively, the first non-central area is located between the central area and the first bus area in the transverse direction, and the second non-central area is located between the central area and the second bus area in the transverse direction, wherein forming the suppression layer for suppressing the transverse mode comprises:

forming a two first temperature compensation layers and a second temperature compensation layer, wherein one of the two first temperature compensation layers covers at least a part of the first non-central area, the other of the two first temperature compensation layers covers at least a part of the second non-central area, and the second temperature compensation layer covers a part of the interdigital transducer located on an outer side each of the two first temperature compensation layers in the transverse direction and a part of the interdigital transducer located between the two first temperature compensation layers in the transverse direction; and wherein a sound velocity in each of the two first temperature compensation layers is lower than a sound velocity in the second temperature compensation layer, the second temperature compensation layer comprises an outer compensation layer located on the outer side of each of the two first temperature compensation layers and an inner compensation layer located between the two first temperature compensation layers, and a sound velocity in the inner compensation layer is different from a sound velocity in the outer compensation layer.

* * * * *